United States Patent
Veliadis

(10) Patent No.: US 8,130,023 B2
(45) Date of Patent: Mar. 6, 2012

(54) SYSTEM AND METHOD FOR PROVIDING SYMMETRIC, EFFICIENT BI-DIRECTIONAL POWER FLOW AND POWER CONDITIONING

(75) Inventor: John V. Veliadis, Hanover, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 12/623,655

(22) Filed: Nov. 23, 2009

(65) Prior Publication Data

US 2011/0121883 A1    May 26, 2011

(51) Int. Cl.
*H03K 17/687* (2006.01)
(52) U.S. Cl. ........................................ 327/430; 327/431
(58) Field of Classification Search .................. 327/430, 327/431; 257/328, 329, 334
See application file for complete search history.

(56) References Cited

U.S. PATENT DOCUMENTS

| | | | | | |
|---|---|---|---|---|---|
| 3,767,946 | A | * | 10/1973 | Berger et al. | 327/581 |
| 4,205,334 | A | * | 5/1980 | Nonaka et al. | 257/264 |
| 4,459,684 | A | * | 7/1984 | Chapman | 365/174 |
| 6,097,046 | A | * | 8/2000 | Plumton | 257/266 |
| 7,719,055 | B1 | * | 5/2010 | McNutt et al. | 257/341 |

* cited by examiner

*Primary Examiner* — Kenneth B. Wells
(74) *Attorney, Agent, or Firm* — Andrews Kurth LLP

(57) ABSTRACT

A system and method for providing symmetric, efficient bi-directional power flow and power conditioning for high-voltage applications. Embodiments include a first vertical-channel junction gate field-effect transistor (VJFET), a second VJFET, a gate drive coupled to the first VJFET gate and the second VJFET gate. Both VJFETs include a gate, drain (D1 and D2), and a source, and have gate-to-drain and gate-to-source built-in potentials. The first VJFET and the second VJFET are connected back-to-back in series so that the sources of each are shorted together at a common point S. The gate drive applies an equal voltage bias ($V_G$) to both the gates. The gate drive is configured to selectively bias $V_G$ so that current flows through the VJFETs in the D1 to D2 direction, flows through the VJFETs in the D2 to D1 direction or voltages applied to D1 of the first VJFET or D2 of the second VJFET are blocked.

21 Claims, 8 Drawing Sheets

SYSTEM AND METHOD FOR PROVIDING SYMMETRIC, EFFICIENT BI-DIRECTIONAL POWER FLOW AND POWER CONDITIONING

The invention was made under a contract with an agency of the United States Government, contract number W911NF-06-2-0002.

BACKGROUND

Inverters/rectifiers and DC/DC converters critical for supporting high-power, high-voltage systems, such as hybrid-electric ground vehicle propulsion systems, typically operate between two high voltage busses with bi-directional power flow of up to hundreds of kilowatts. To prevent system damage during fault conditions, bi-directional fault isolation, or power conditioning, is needed. Because mechanical contactors do not provide adequate actuation times and suffer severe degradation during repeated fault isolation, a solid-state circuit breaker (SSCB) is desirable.

To provide such a SSCB, and to enable such bi-directional power flow in a semiconductor device, the device should provide symmetric current flow in forward and reverse directions and blocking of a specified voltage in forward and reverse directions. In addition, the gate-drive of the bi-directional circuit should operate at high current-gain and high bandwidth with low conduction losses, should allow for fast switching, and should have small physical size, all of which contribute to the bi-directional circuit's efficiency.

SUMMARY

A system and method for providing symmetric, efficient bi-directional power flow in high-voltage power conditioning applications. Embodiments of a system for providing symmetric, efficient bi-directional power flow for high-voltage power conditioning applications include a first vertical-channel junction gate field-effect transistor (VJFET), a second VJFET, a gate drive coupled to the first VJFET gate and the second VJFET gate. The first VJFET includes a gate, drain ($D1$), and source, and has gate-to-source and gate-to-drain built-in potentials. The second VJFET includes a gate, drain ($D2$), and source, and has gate-to-source and gate-to-drain built-in potentials and the first VJFET and the second VJFET are connected back-to-back in series so that the first VJFET source and the second VJFET source are shorted together at a common point S. The gate drive applies an equal voltage bias ($V_G$) to both the first VJFET gate and the second VJFET gate and the gate drive is configured to selectively bias $V_G$ so that the system allows current to flow through the first VJFET and the second VJFET in the D1 to D2 direction or to flow through the second VJFET and the first VJFET in the D2 to D1 direction or so that the system blocks voltages applied to D1 of the first VJFET or D2 of the second VJFET.

Embodiments of a method for providing symmetric, efficient bi-directional power flow and power conditioning for high-voltage applications include providing a first vertical-channel junction gate field-effect transistor (VJFET) and providing a second VJFET. The first VJFET includes a gate, drain ($D_1$), and source, and has gate-to-source and gate-to-drain built-in potentials. The second VJFET includes a gate, drain ($D_2$), and source, and has gate-to-source and gate-to-drain built-in potentials. The method further includes connecting the first VJFET and the second VJFET back-to-back in series so that the first VJFET source and the second VJFET source are shorted together at a common point S, coupling a gate drive to the first VJFET gate and the second VJFET gate, and selectively applying an equal voltage bias ($V_G$) from the gate drive to both the first VJFET gate and the second VJFET gate so that current flows through the first VJFET and the second VJFET in the $D_1$ to $D_2$ direction or current flows through the second VJFET and the first VJFET in the $D_2$ to $D_1$ direction or so that voltages applied to $D_1$ of the first VJFET or $D_2$ of the second VJFET are blocked.

DESCRIPTION OF THE DRAWINGS

The detailed description will refer to the following drawings, wherein like numerals refer to like elements, and wherein.

DETAILED DESCRIPTION

Silicon devices are technologically mature but suffer from high conduction and switching losses, low bandwidth, and are limited to about 125° C. operation. Silicon carbide (SiC) and gallium nitride (GaN) are typically excellent materials for bi-directional power conditioning since they can block high voltages with relatively low associated conduction and switching losses. Several SiC power devices are candidates for bi-directional power conditioning, such as SiC bipolar junction transistors (BJTs), SiC metal oxide semiconductor field effect transistors (MOSFETs), lateral-channel vertical junction field-effect-transistors (JFETs), and vertical-channel junction-field-effect-transistors VJFETs.

SiC BJTs currently suffer from forward voltage degradation (which is a reliability issue) and have a relatively low current-gain that complicates and increases the size of the gate drive. Also, SiC BJT current-gain deteriorates with temperature, limiting operation to below 200° C. SiC MOSFETs suffer from low mobility and reliability stemming from their native gate oxides. SiC MOSFET operation is limited to ~200° C. due to its native gate oxide instability and its threshold-voltage-shift. SiC lateral-channel vertical JFETs have relatively high resistance (e.g., lateral-channel vertical JFETs typically have twice the resistance of vertical-channel JFETs), and inherent fabrication complexities. SiC vertical-channel JFETs are ideal candidates for bidirectional power flow applications as they have low switching and conduction losses, are relatively easy to fabricate, and can operate at temperatures in excess of 300° C.

Embodiments of a system and method for providing symmetric, efficient bi-directional power flow and power conditioning are described herein. Embodiments provide a more energy efficient system for bi-directional power flow that can operate at high temperatures, such as at 300° C., high frequencies, high current-gain, and has no native gate-oxide or forward-voltage degradation reliability concerns. Embodiments may include SiC VJFETs in a back-to-back configuration, with specified biasing settings, to provide efficient and symmetrical bi-directional power flow and power conditioning. Such embodiments provide a SSCB that overcomes problems described above. VJFETs do not have native gate-oxide or forward-voltage degradation reliability concerns, have been operated in excess of 300° C. and can be operated at high-current gain.

Figure 1:
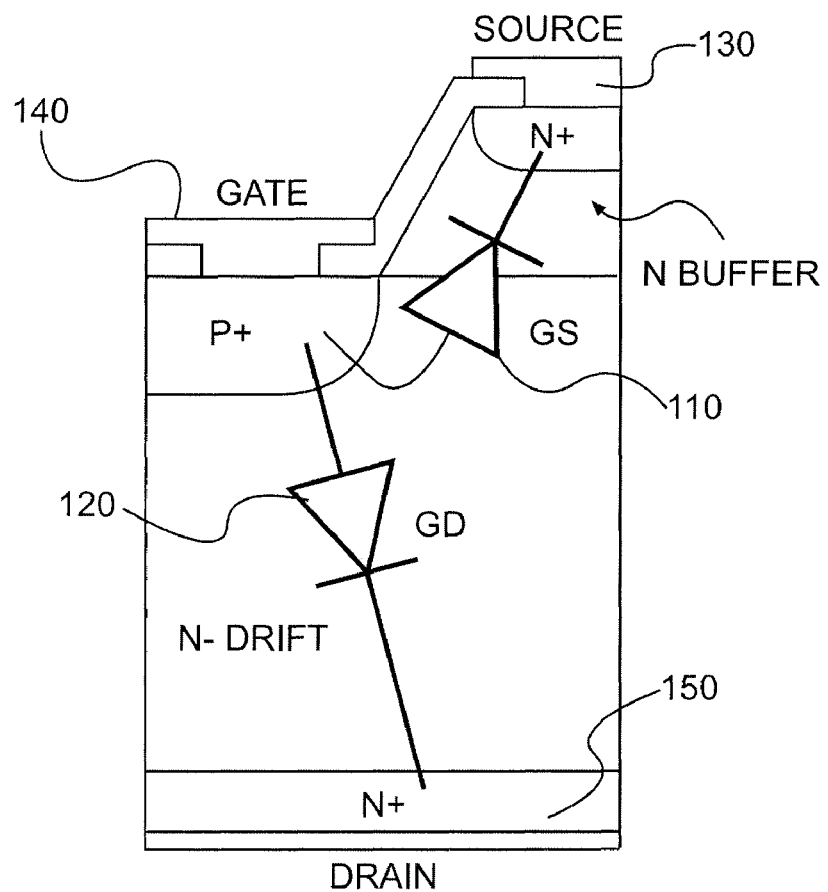
FIG. 1 is a diagram illustrating an embodiment of a high-voltage silicon carbide vertical channel junction field effect transistor (VJFET).

With reference now to FIG. 1, shown is an embodiment of a SiC VJFET 100 that may be used in the back-to-back configuration described above. VJFET 100 includes a gate-to-drain (GD) pn junction 120, i.e., GD diode, and a gate-to-source (GS) pn junction 110, i.e., GS diode. VJFET 100 also includes a source terminal 130, a gate terminal 140, and a drain terminal 150. FIG. 1 also illustrates the various p+ (gate), n+ (source), n– drift (drift layer) and n+ (buffer and substrate) regions of VJFET 100. Although VJFET 100 is fabricated from silicon carbide (SiC), other materials suitable for high-voltage applications, such as gallium nitride (GaN), gallium arsenide (GaAs), and diamond can be used.

Figure 2:
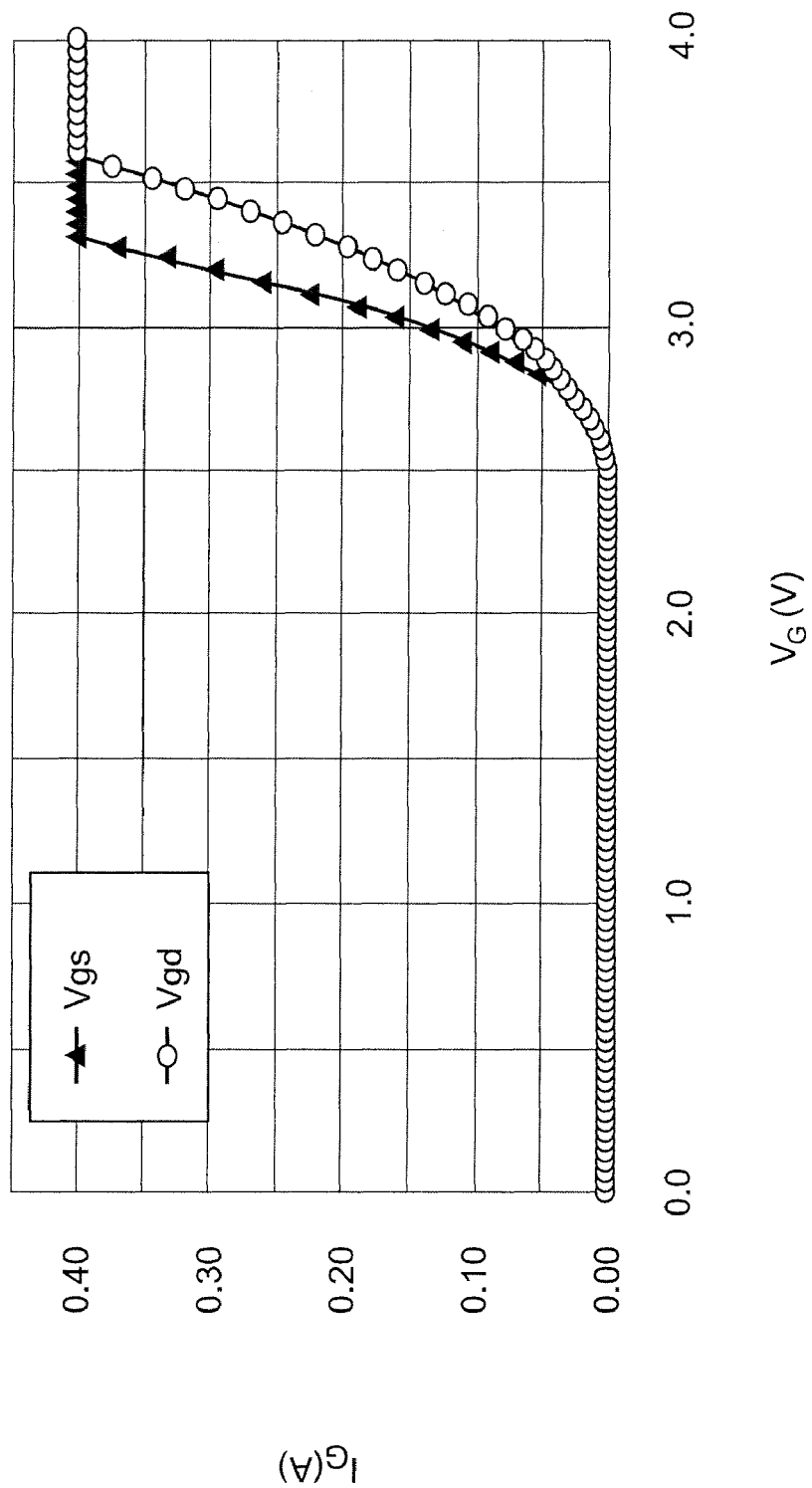
FIG. 2 is a graph illustrating forward gate-to-source and gate-to-drain voltage bias characteristics of a high-voltage SiC VJFET.

With reference now to FIG. 2, shown is a graph illustrating forward GS pn junction 110 and GD pn junction 120 characteristics of a VJFET such as VJFET 100. Specifically, the graph illustrates gate-current as a function of gate-to-source bias ($V_{GS}$) and gate-to-drain bias ($V_{GD}$). As shown, for doping levels relevant to power conditioning applications such as in the embodiments described herein, the wide band-gap of SiC power devices may lead to GS pn junction and GD pn junction built-in potentials (turn-on) of about 2.7 V.

With reference again to FIG. 1, the GS pn junction 110 typically has a breakdown voltage of less than 100 V and may be used to control the current flow through the VJFET 100. The GD pn junction 120 typically has a breakdown voltage that is primarily determined by the thickness and doping levels of the VJFET 100 drift layer (n– drift), and blocks the high voltages present in power conditioning applications. Typical VJFET gate-to-drain pn junctions block from a few hundred to tens of thousands of volts.

An important characteristic for efficient power VJFET gate-drive operation is maintaining high current-gain voltage-control capability by biasing the gate-to-source and gate-to-drain pn junctions below their built-in potential values. If the gate voltage exceeds these values bipolar gate-current is generated, current-gain deteriorates exponentially, and significant current-handling capability may be needed of the gate drive, which may result in increased physical-size and conduction losses. Bipolar gate-current will reduce switching speed, which increases switching losses and limits switching frequency. In addition, under bipolar gate-to-drain current flow (gate-to-drain junction turned on), electron-hole pair recombinations at basal-plane-dislocations in the drift layer of the VJFET may induce stacking fault formation and expansion, which may cause forward voltage degradation and eventual device failure. Accordingly, for efficient gate-drive operation the VJFET's gate junctions need to be biased below their turn-on voltages. Under this gate biasing condition and for low-resistance on-state conduction, VJFETs capable of blocking in excess of 1200 V are typically designed normally-on (N-ON), i.e., the VJFETs block their specified voltage with a negative bias applied to their gates.

In the example illustrated in FIGS. 1 and 2, when the gate drive voltage $V_G$ reaches about 2.7 V or higher, the GD and GS diodes are turned on, i.e., the built-in potential of the gate is 2.7 V. The built-in potential value of a SiC VJFET may vary depending on design, layer doping and thickness levels, manufacturing tolerances, passivation techniques etc. However, the gate-to-drain (GD) pn junction 120 and gate-to-source (GS) pn junction 110 must be biased below their built-in potential value, for efficient gate drive operation and device reliability. Under such circumstances, the GS and GD diodes are not turned on, very little gate current is needed, and no bipolar gate current is present.

Figure 3:
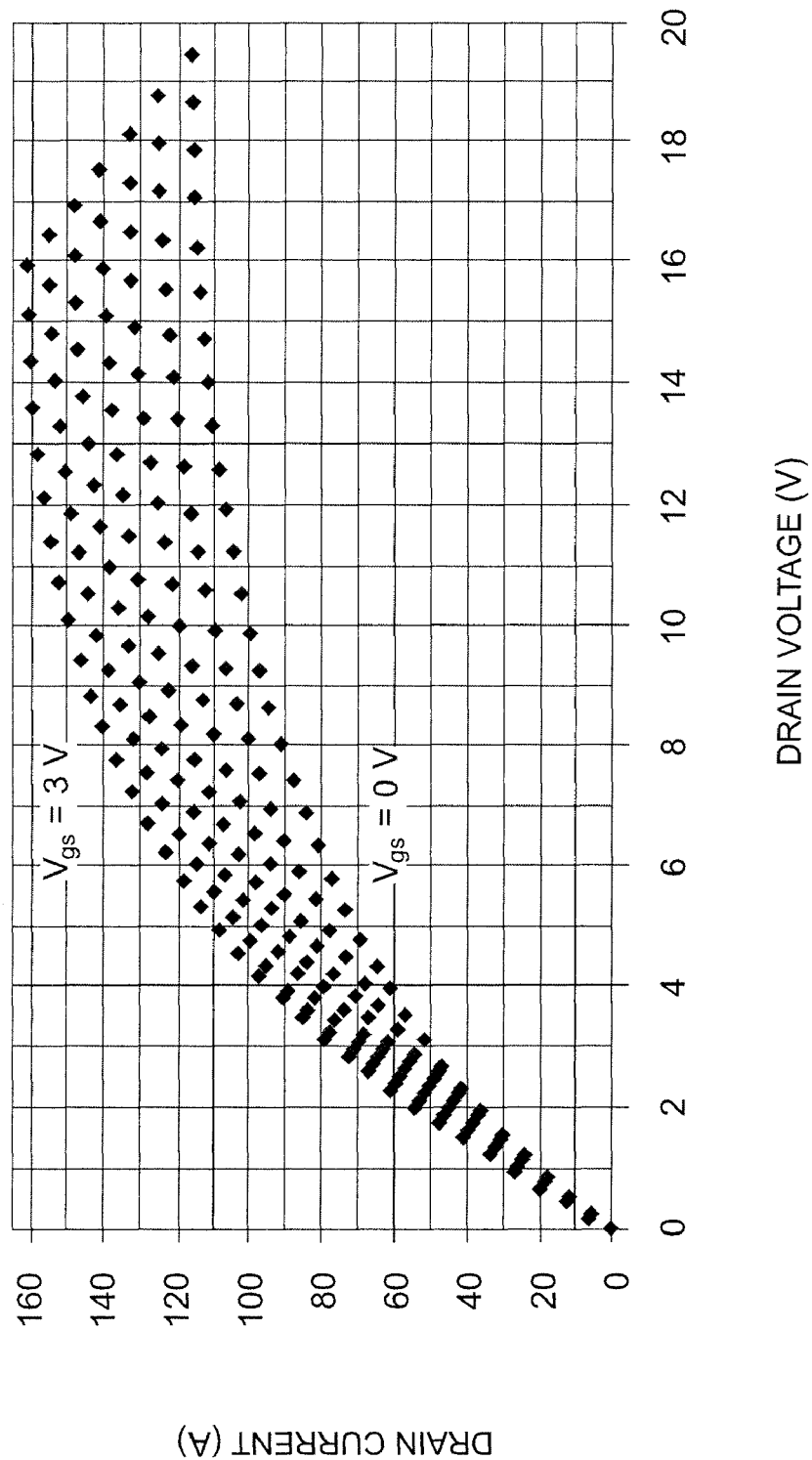
FIG. 3 is a graph illustrating on-state drain current versus drain voltage characteristics of a high-voltage SiC VJFET at positive gate-to-source biases.

With reference now to FIG. 3, shown is a graph illustrating typical on-state drain current characteristics versus drain voltage of a high-voltage SiC VJFET, such as VJFET 100. The graph shows the drain current vs. drain voltage characteristics at a gate-to-source bias $V_{GS}$ range of 0 to 3 volts in steps of 0.5 volts. As expected, at zero gate bias ($V_{GS}$=0V), the normally-on VJFET 100 conducts current.

Figure 4:
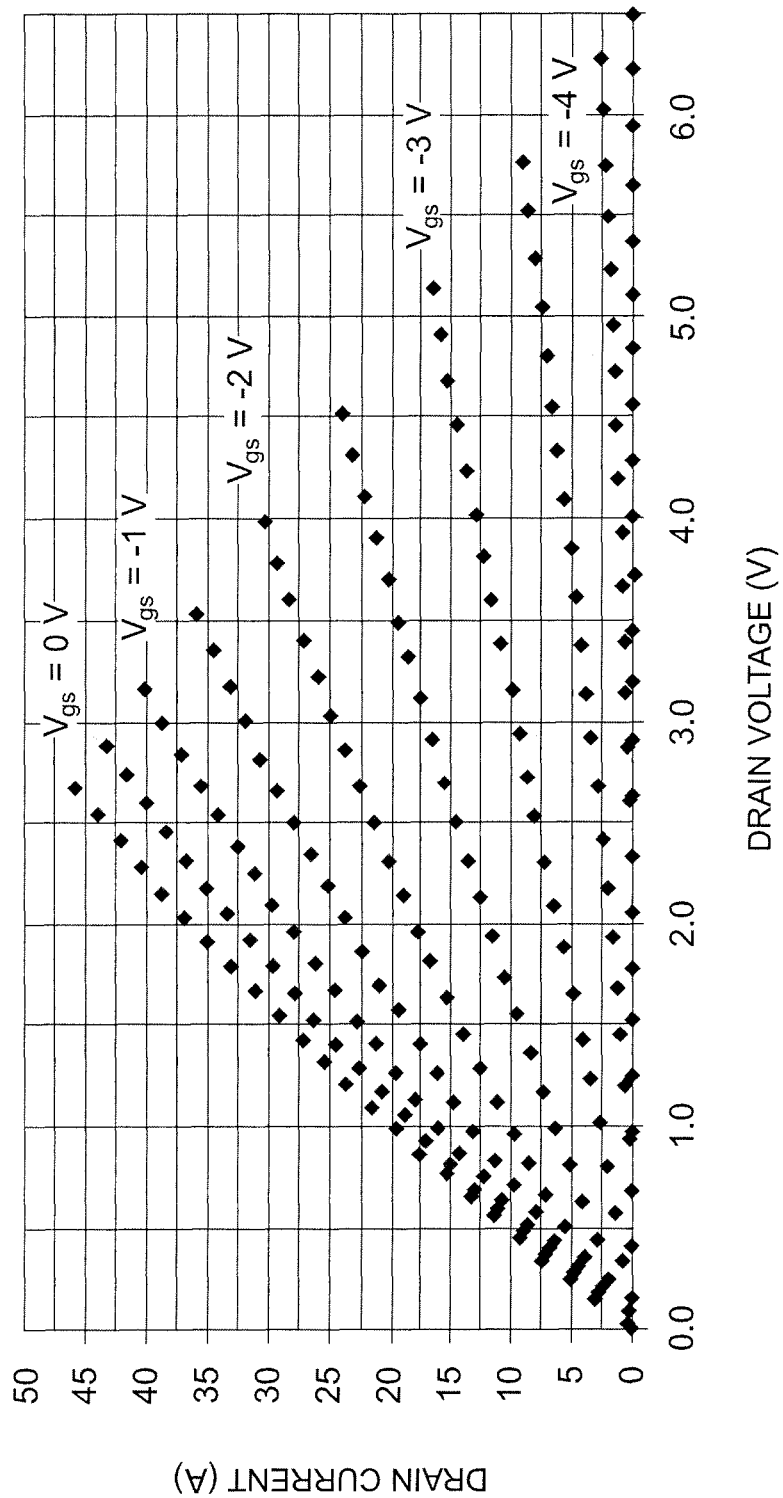
FIG. 4 is a graph illustrating on-state drain current versus drain voltage characteristics of a high-voltage SiC VJFET at negative gate-to-source biases.

With reference now to FIG. 4, shown is another graph illustrating typical on-state drain current characteristics versus drain voltage of a high-voltage SiC VJFET, such as VJFET 100, in this example for a gate-to-source bias $V_{GS}$ range of 0 to –4.5 volts in steps of 0.5 volts. At a gate-to-source bias of –4.5 volts ($V_{GS}$=–4.5 V), the channel of VJFET 100 is pinched-off and negligible current flows through the drain of VJFET 100.

From FIGS. 3 and 4, it is apparent that increasing the bias applied to the GS pn junction of a VJFET results in desirable higher current capability. However, as previously mentioned, the GS pn junction must biased below its built-in potential, e.g., 2.7 V, for efficient gate drive operation and reliability.

Figure 5:
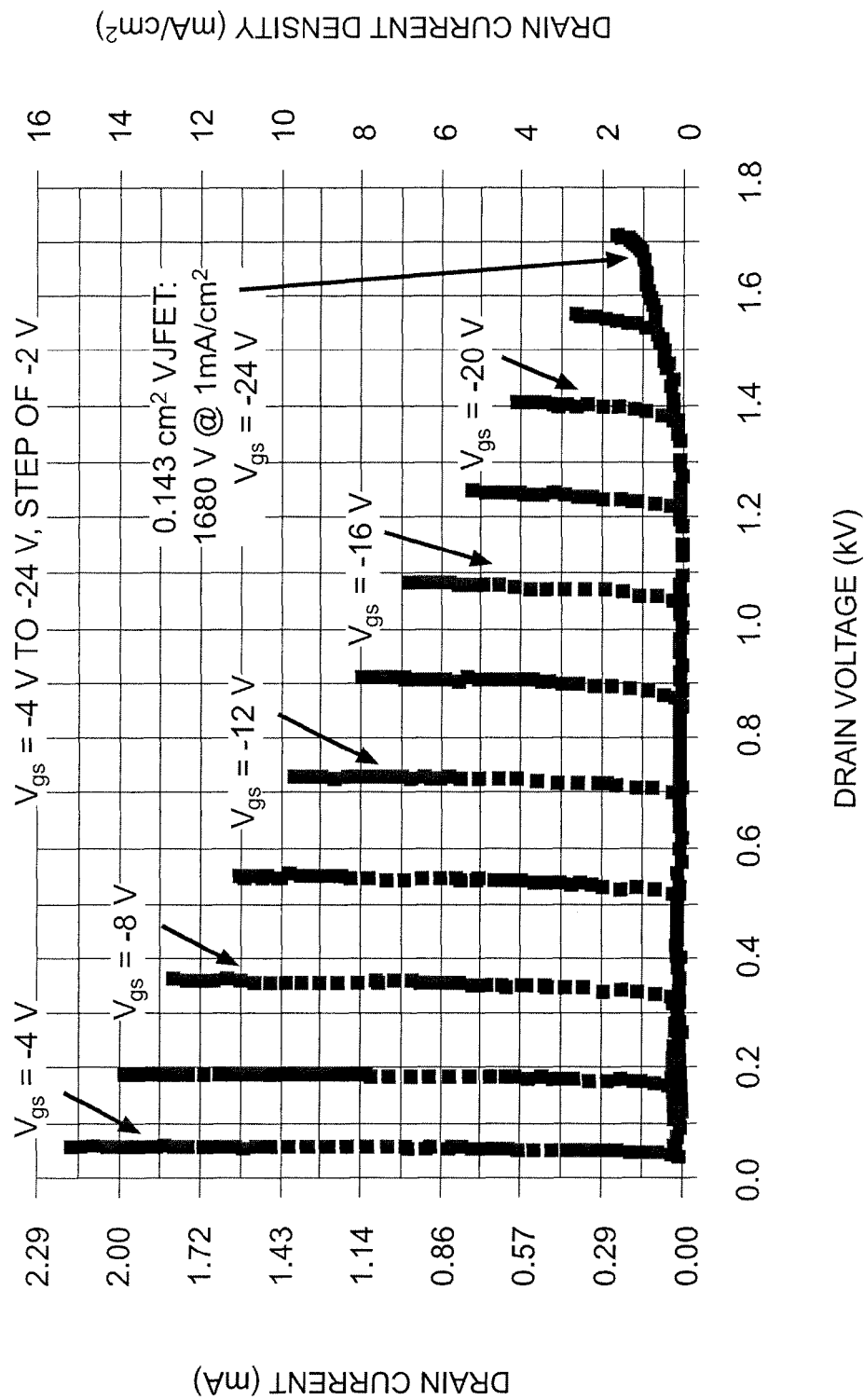
FIG. 5 is a graph illustrating example blocking-voltage characteristics of a normally-on a high-voltage SiC VJFET.

With reference now to FIG. 5, shown is a graph illustrating example blocking-voltage characteristics of a normally-on VJFET, such as VJFET 100, for gate-to-source biases, $V_{GS}$, in the –4 volt to –24 volt range, in steps of –2 volts. The VJFET is normally-on and a negative gate bias is needed to block a specified voltage. For example, a negative gate-to-source bias of –18 volts ($V_{GS}$=–18 V) is needed to block a drain voltage of 1200 volts. This graph shows that very large voltages applied to the drain of a VJFET, such as VJFET 100, may be blocked by relatively small negative gate drive voltage.

With reference again to FIG. 1, and with consideration of the preceding graphs, when a sufficient negative gate-to-source voltage is applied, a high drain voltage is blocked by GD pn junction 120, which becomes reverse biased when a drain voltage is applied. However, a high source voltage cannot be blocked as the GS pn junction 120 can only block low voltages and the GD pn junction 110 is forward biased for a high source voltage. Accordingly, a single VJFET is not capable of bidirectional voltage blocking operation.

To enable bidirectional current and voltage operation, two VJFETs can be connected in series with their sources at a common point (back-to-back source configuration). In this configuration, each VJFET can have a dedicated drive biasing its gate. However, each VJFET having its own dedicated gate-drive biasing its gate leads to larger "gate drive real estate" requirements, gate-drive synchronization complexities, higher losses, and lower efficiency. Bidirectional power operation may also be achieved with two VJFETs connected in series with their drains at a common point (back-to-back drain configuration). The derived gate junction biasing conditions may be the same for this case.

Figure 6:
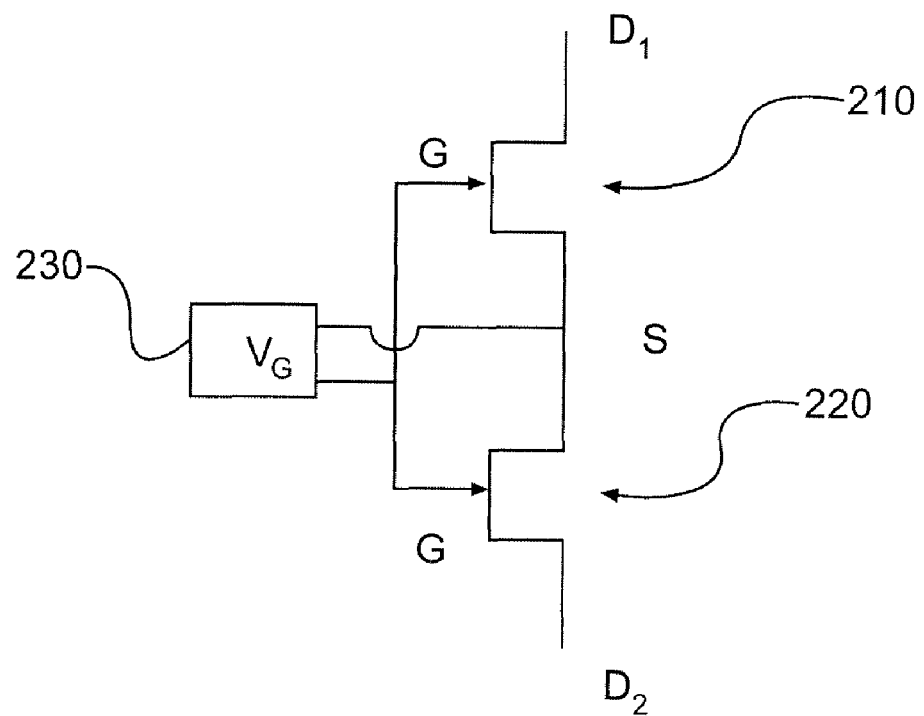
FIG. 6 is a diagram illustrating an embodiment of a system for providing symmetric, efficient bi-directional power flow.

With reference now to FIG. 6, shown is a diagram illustrating an embodiment of system 200 providing symmetric, efficient bi-directional power flow and power conditioning. In system 200, two wide-bandgap, high-voltage VJFETs, i.e., VJFET1 210 and VJFET2 220, are connected in series with their sources shorted together at a common point referred to as S. Also, VJFET1 210 and VJFET2 220 are driven by a single gate drive 230, which applies a common, equal bias $V_G$ to their gates G. Gate drive 230 applies equal gate biases to both VJFETs and is thus coupled to each gate G of VJFET1 210 and VJFET2 220 and is referenced to the common point S. In other words, instead of each VJFET having a dedicated drive biasing its gate, one gate drive is driving both gates, applying an equal bias to the gates G of VJFET1 210 and VJFET2 220. The common bias $V_G$ may be referred to as gate bias $V_G$. The gate bias $V_G$ may be applied substantially simultaneously or with a small delay (e.g., a few milliseconds or less) in its application to each VJFET (e.g., the gate bias $V_G$ may be applied to the gate G of VJFET 210, and after the small delay, to the gate G of VJFET 230, or vice-versa). The gate drive 230 is referenced to the common S point where the sources of the two VJFETs are shorted. VJFET1 210 and VJFET2 220 have separate drains, $D_1$ and $D_2$, respectively. Although VJFET1 210 and VJFET2 220 are fabricated from SiC, other materials suitable for high-voltage applications, such as gallium nitride (GaN), gallium arsenide (GaAs), and diamond can be used.

System 200 includes gate bias $V_G$ settings for efficient and symmetrical bi-directional power flow and power conditioning in high voltage applications requiring from a few hundred to tens of thousands of volts. Consequently, gate drive 230 is configured to provide (a) gate biases $V_G$ that enable efficient and symmetrical bi-directional current flow through system 200 (i.e., on-state current flow from $D_1$ of VJFET1 210 to $D_2$ of VJFET2 220, and vice-versa) and (b) gate biases $V_G$ that block high voltages applied to $D_1$ or $D_2$ of VJFET1 210 and VJFET2 220, respectively. Gate drive 230 may be programmed or otherwise configured to determine when to allow power flow through VJFET1 210 and VJFET2 220 (i.e., when to apply gate bias (a)) and when to block voltages applied to $D_1$ or $D_2$ (i.e., when to apply gate bias (b)). Gate drive 230 may include programmed hardware (e.g., a programmed application specific integrated chip (ASIC)) or a processor and memory that includes instructions, for execution by processor, that receive various inputs, determine when to apply (a) or (b), and control gate drive 230 to apply (a) or (b). Alternatively, gate drive 230 may be configured to apply (a) or (b) based on a control signal or other input received. One of ordinary skill in the art would understand how to configure and design gate drive 230 based on the requirements of the application in which system 200 is used.

With continuing reference to FIG. 6, the below describes the appropriate gate biases $V_G$ (a) and (b) for system 200. As described above, for gate drive 230 to operate with low conduction losses, low switching losses, high frequency, and small physical size, the gate current it supplies to VJFET1 210 and VJFET2 220 may need to be as small as possible. Accordingly, the GD pn junctions and GS pn junctions of VJFET1 210 and VJFET2 220 are preferably biased below their built-in potential, e.g., ~2.7 V. In addition, biasing the GD pn junctions below their built-in potential contributes to higher VJFET reliability.

Symmetrical and Bi-Directional on-State Current Flow

The following describes the gate bias $V_G$ settings for efficient symmetrical and bi-directional current flow through system 200 (i.e., bias settings (a) described above). The gate bias $V_G$ setting for current flow in the direction of $D_1$ to $D_2$ is described first.

Current Flow Direction $D_1$ to $D_2$

In the current flow direction from $D_1$ to $D_2$, the drain $D_1$ of VJFET1 210 is at a higher voltage than the drain $D_2$ of VJFET2 220.

From Kirchoff's law, the voltages, i.e., $V_{GD1}$ and $V_{GD2}$, across the gate-to-drain diodes, i.e., diodes between G and $D_1$ of VJFET1 210 and G and $D_2$ of VJFET2 220, respectively (not shown in FIG. 6—see FIG. 1) are:

$$VJFET1: V_{GS}=V_{GD1}+V_{D1S} \Leftrightarrow V_{GD1}=V_{GS}-V_{D1S} \quad (1)$$

$$VJFET2: V_{GS}=V_{GD2}+V_{D2S} \Leftrightarrow V_{GD2}=V_{GS}-V_{D2S} \quad (2)$$

Where $V_{D1S}$ and $V_{D2S}$ are voltages across drain-to-source, i.e., between $D_1$ of VJFET1 210 and $D_2$ of VJFET2 220 and common source S, respectively (not shown in FIG. 6—see FIG. 1) and $V_G=V_{GS}$, since there is a common gate drive 230 and a common source S. Assuming a diode built-in potential of ~2.7 V and a safety margin of 0.2 V, $V_{GS}$, $V_{GD1}$, and $V_{GD2}$ must be less or equal to 2.5 V (see FIG. 2) for efficient low-current gate-drive operation (i.e., to avoid turning on GD and GS diodes). From FIGS. 3-4 it is seen that a $V_{GS}$ value as close as possible to 2.5 V is needed for high transistor drain current flow and low gate current, with $V_{GS}$=2.5 V being the maximum. For the $D_1$ to $D_2$ current flow direction, $V_{D1}S$ is always positive and from Eq. (1) with $V_{GS}$ being 2.5 V or less, $V_{GD1}$ will always be below 2.5 V. On the other hand, $V_{D2S}$ is always negative and therefore Eq. 2 sets the maximum allowable value of $V_{GS}$:

$$V_{GD2}=V_{GS}-V_{D2S}=V_{GS}+|V_{D2S}|\leq 2.5V \Rightarrow V_{GS} \leq 2.5V-|V_{D2S}| \quad (3)$$

As an example of $D_1$ to $D_2$ current flow, a 4 volt drop across the back-to-back VJFET1 210 and VJFET2 220 is assumed. For simplicity, assume the drain $D_1$ of VJFET1 210 is biased at 4 volts and the drain $D_2$ of VJFET2 consequently biased at 0 volts. Assuming VJFETs with similar specifications and resistances, point S is at a bias of approximately 2 volts. Under these biasing conditions, $|V_{D2S}|=2$ V and from Eq. (3), the maximum gate voltage that ensures efficient operation is $V_{GS}$=0.5 V. For $V_{GS}$=0.5 V, Eqs. (1) and (2) result in $V_{GD2}$=2.5 V and $V_{GD1}$=−1.5 V. All gate pn junctions are below their built-in potential of ~2.7 V and efficient low gate drive operation is possible.

Current Flow Direction $D_2$ to $D_1$

In the current flow direction from $D_2$ to $D_1$, the drain $D_2$ of VJFET2 220 is at a higher voltage than the drain $D_1$ of VJFET1 210. Accordingly, in FIG. 6 the current flow is from $D_2$ to $D_1$. As in the $D_1$ to $D_2$ case, and again assuming a built-in potential of ~2.7 V and a safety margin of 0.2 V, $V_{GS}$, $V_{GD1}$, and $V_{GD2}$ must be less or equal to 2.5 V (see FIG. 2) for efficient low-current gate-drive operation. From FIGS. 3-4 it is seen that a $V_{GS}$ value as close as possible to 2.5 V is desirable for high transistor drain current flow and low gate current, with $V_{GS}$=2.5 V being the maximum. For the $D_2$ to $D_1$ current flow direction, $V_{D2S}$ is always positive and from Eq. (2) $V_{GD2}$ will always be below 2.5 V for $V_{GS}$ of 2.5 V or less. On the other hand, $V_{D1s}$ is always negative and therefore Eq. (1) sets the maximum allowable value of $V_{GS}$:

$$V_{GD1}=V_{GS}-V_{D1S}=V_{GS}+|V_{D1S}|\leq 2.5V \Rightarrow V_{GS}\leq 2.5V-|V_{D1S}| \quad (4)$$

As an example of $D_2$ to $D_1$ current flow, a 4 volt drop across the back-to-back VJFET1 210 and VJFET2 220 is assumed. For simplicity, assume the drain $D_2$ of VJFET2 220 is biased at 4 volts and the drain $D_1$ of VJFET1 210 is consequently biased at 0 volts. Assuming VJFETs with similar specifications and resistances, the point S is at a bias of approximately 2 Volts. Under these biasing conditions, $|V_{D1S}|=2$ V and from Eq. (4), the maximum gate voltage that ensures efficient operation is $V_{GS}=0.5$ V. For $V_{GS}=0.5$ V, Eqs. (1) and (2) result in $V_{GD2}=-1.5$ V and $V_{GD1}=2.5$ V. $V_{GS}$, $V_{GD1}$, and $V_{GD2}$ are below their built-in potential of ~2.7 V and efficient low gate drive operation is possible.

Consequently, efficient, bi-directional back-to-back VJFET current flow with a single gate bias $V_G$ coming from a single gate drive 230 that operates efficiently with low losses and high bandwidth meets the following equation (for a SiC VJFET with a built-in potential of ~2.7 V; for SiC VJFET with a different built-in potential, or VJFET fabricated from other materials with a different built-in potential, the equation below would be adjusted accordingly):

$$V_{GS} \leq 2.5V - |V_{D2S}| \text{ and } V_{GS} \leq 2.5V - |V_{D1S}| \quad (5)$$

As described above, when symmetrical, bi-directional current flow is required by the application in which system 200 is utilized, gate drive 230 will supply a single gate bias $V_G=V_{GS}$ that satisfies these equations. Gate drive 230 may include control circuitry or software for determining the appropriate gate bias $V_G$ based on these equations and when to apply such gate bias $V_G$ in order to enable symmetrical, bi-directional current flow and when not to apply such gate bias $V_G$. Alternatively, control circuitry or software for determining when to apply such gate bias $V_G$ in order to enable symmetrical, bi-directional current flow and when not to apply such gate bias $V_G$ may be external to gate drive 230 and may simply send control signal to gate drive 230 to set gate bias $V_G$ at the appropriate level.

Bidirectional Voltage-Blocking

The following describes the gate bias $V_G$ settings for high-voltage power conditioning through system 200 (i.e., high-voltage blocking bias settings (b) described above). As illustrated in FIG. 5, system 200 can block voltages from 0V to multiple Kilovolts (kV). In high-voltage applications, the voltages that system 200 would typically block would be in the Kilovolt range. The maximum voltage that system 200 could block would be determined by the design and specifications of each VJFET in system 200 and vary depending on the materials used to fabricate the VJFETs and variations in fabrication. The gate bias $V_G$ setting for high-voltage blocking in the direction of $D_1$ to $D_2$ is described first.

Voltage Blocking Direction $D_1$ to $D_2$

When high voltages are applied to the drain $D_1$ of VJFET1, the gate-to-drain diode of VJFET1 is reverse biased and blocks the voltage (up to its specification). VJFET2 does not contribute to blocking high voltage. Repeating Equations (1) and (2):

$$VJFET1: V_{GS}=V_{GD1}+V_{D1S} \Leftrightarrow V_{GD1}=V_{GS}-V_{D1S} \quad (1)$$

$$VJFET2: V_{GS}=V_{GD2}+V_{D2S} \Leftrightarrow V_{GD2}=V_{GS}-V_{D2S}=V_{GS}+V_{SD2} \quad (2)$$

Typical blocking-voltage characteristics of a normally-on VJFET are shown in FIG. 5. A negative $V_{GS}$ bias must be applied to block the specified high voltage. In equation (1), $V_{GS}$ is negative for voltage-blocking and $V_{D1S}$ is a positive high voltage. Therefore $V_{GD1}$ is negatively biased, and both the gate-to-drain and gate-to-source diodes of VJFET1 are negatively biased, which allows for low gate-current operation.

VJFET2 experiences the same negative $V_{GS}$ bias needed by VJFET1 to block high voltage. Because of the voltage-blocking, a leakage current below a few microamperes, I SD2, flows from $D_1$ to $D_2$. $V_{SD2}=I_{SD2} \cdot R_{SD2}$ is positive and in the micro-volt range and the sum of $V_{GS} V_{SD2}=V_{GD2}$ is a negative voltage. Therefore, both the gate-to-drain pn junction and the gate-to-source pn junction of VJFET2 are also reverse biased, which allows for low gate-current operation.

In summary, in the $D_1$ to $D_2$ blocking-voltage mode, both normally-on back-to-back VJFET1 210 and VJFET2 220 have their gate-to-source and gate-to-drain diodes negatively biased allowing for efficient gate-drive operation. The gate-to-drain diode of VJFET1 is negatively biased and blocks the high voltage.

The gate bias $V_G$ setting for high-voltage blocking in the direction $D_2$ to $D_1$ (the $D_2$ to $D_1$ blocking-voltage mode) is demonstrated below:

Voltage Blocking Direction $D_2$ to $D_1$

When high voltages are applied to the drain $D_2$ of VJFET2, the gate-to-drain diode of VJFET2 is reverse biased and blocks the voltage (up to its specification). VJFET1 does not contribute to blocking high voltage. Repeating Equations (1) and (2):

$$VJFET1: V_{GS}=V_{GD1}+V_{D1S} \Leftrightarrow V_{GD1}=V_{GS}-V_{D1S}=V_{GS}+V_{SD1} \quad (1)$$

$$VJFET2: V_{GS}=V_{GD2}+V_{D2S} \Leftrightarrow V_{GD2}=V_{GS}-V_{D2S} \quad (2)$$

Typical blocking-voltage characteristics of a normally-on VJFET are shown in FIG. 5. A negative $V_{GS}$ gate bias must be applied to block the specified high voltage. In equation (2), the $V_{GS}$ of VJFET2 is negative for voltage-blocking and $V_{D2S}$ is a positive high voltage. Therefore, $V_{GD2}$ is negatively biased, and both the gate-to-drain and gate-to-source diodes of VJFET2 are negatively biased, which allows for low gate-current operation.

VJFET1 experiences the same negative $V_{GS}$ bias needed by VJFET2 to block high voltage. Because of the voltage-blocking, a leakage current below a few microamperes $I_{SD1}$ flows from $D_2$ to $D_1$. $V_{SD1}=I_{SD1} \cdot R_{SD1}$ is positive and in the micro-volt range and the sum of $V_{GS}+V_{SD1}=V_{GD1}$ is a negative one. Therefore, both the gate-to-drain and gate-to-source diodes of VJFET1 are negatively biased, which allows for low gate-current operation.

In summary, in the $D_2$ to $D_1$ blocking-voltage mode, both normally-on back-to-back VJFET1 210 and VJFET2 220 have their gate-to-source and gate-to-drain diodes negatively biased allowing for efficient gate-drive operation. The gate-to-drain diode of VJFET2 is negatively biased and blocks the high voltage.

As described above, when a $D_1$ to $D_2$ blocking-voltage mode or $D_2$ to $D_1$ blocking-voltage mode is required by the application in which system 200 is utilized, gate drive 230 will supply a single gate bias $V_G=V_{GS}$ that satisfies the above equations. Gate drive 230 may include control circuitry or software for determining the appropriate gate bias $V_G$ based on these equations and determining when to apply such gate bias $V_G$ in order to enable $D_1$ to $D_2$ or $D_2$ to $D_1$ blocking-voltage modes and when not to apply such gate bias $V_G$. Alternatively, control circuitry or software for determining the appropriate gate bias $V_G$ and when to apply such gate bias $V_G$ may be external to gate drive 230 and may simply send control signal to gate drive 230 to set gate bias $V_G$ at the appropriate level.

Figure 7:
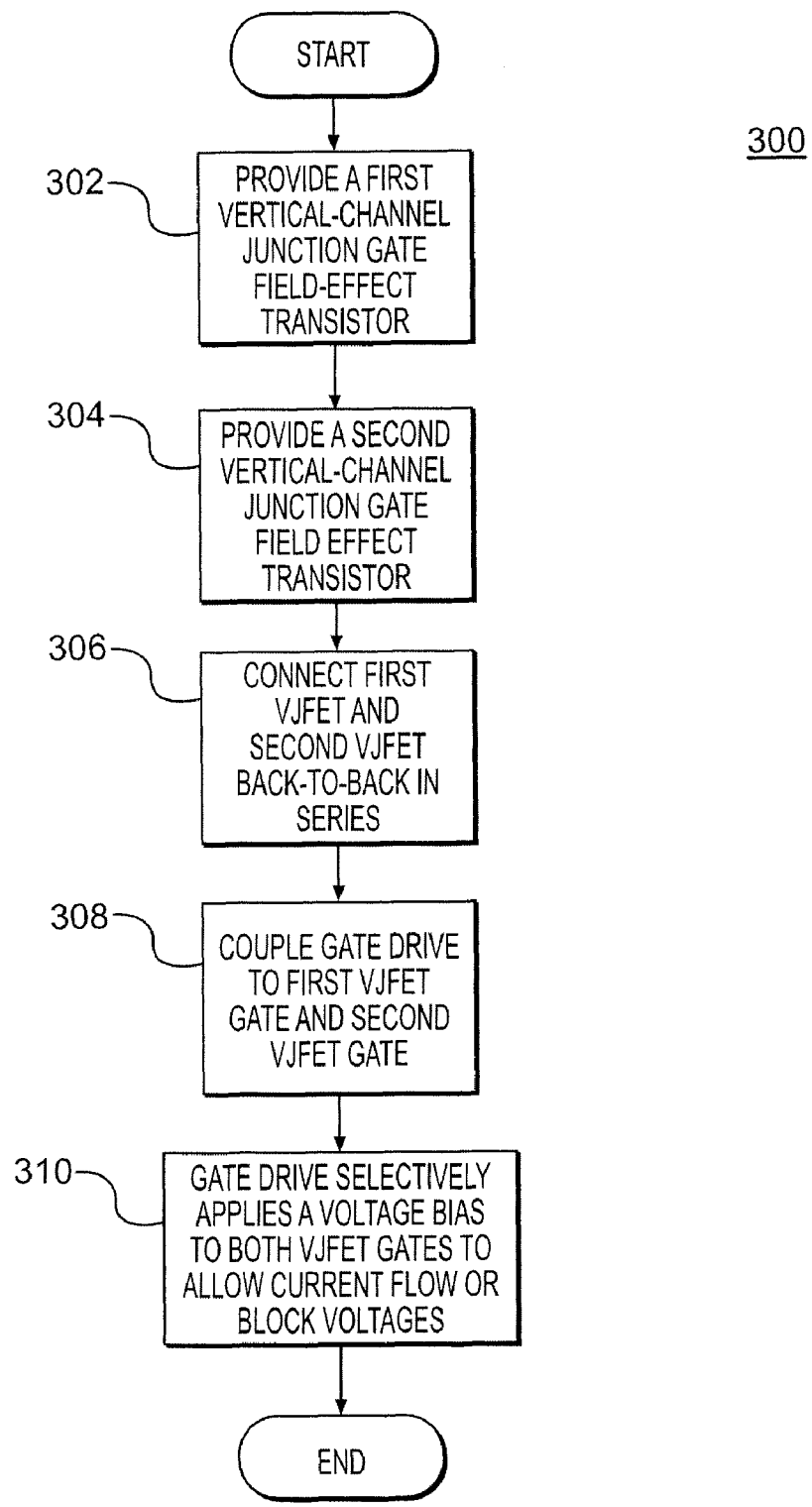
FIG. 7 is a flowchart illustrating an embodiment of a method for providing symmetric, efficient bi-directional power flow.

With reference to FIG. 7, shown is a flowchart of an embodiment of method 300 for providing symmetric, efficient bi-directional power flow and power conditioning. Method 300 provides a first vertical-channel junction gate field-effect transistor (VJFET), block 302. As shown above, the first VJFET includes a gate, drain ($D_1$), and source, and has gate-to-drain and gate-to-source built-in potentials. A second VJFET that includes a gate, drain ($D_2$), and source, and has gate-to-drain and gate-to-source built-in potentials is also provided, block 304. The first VJFET and the second VJFET are connected back-to-back in series, block 306, so that the first VJFET source and the second VJFET source are shorted together at a common point S. A gate drive is coupled to the first VJFET gate and the second VJFET gate, block 308. The gate drive selectively applies an equal voltage bias ($V_G$) to both the first VJFET gate and the second VJFET gate, block 310, so that current flows through the first VJFET and the second VJFET in the $D_1$ to $D_2$ direction or current flows through the second VJFET and the first VJFET in the $D_2$ to $D_1$ direction or so that voltages applied to $D_1$ of the first VJFET or $D_2$ of the second VJFET are blocked. The gate drive may selectively apply $V_G$ to allow current to flow through the first VJFET and the second VJFET in the $D_1$ to $D_2$ direction by setting $V_G$ equal to or less than the gate-to-drain built-in potential of the second VJFET minus the absolute value of the voltage measured across $D_2$ to S, as shown above. Likewise, the gate drive may selectively apply $V_G$ to allow current to flow through the second VJFET and the first VJFET in the $D_2$ to $D_1$ direction by setting $V_G$ equal to or less than the gate-to-drain built-in potential of the first VJFET minus the absolute value of the voltage measured across $D_1$ to S, as shown above. The gate drive may selectively apply $V_G$ to block voltages applied to $D_1$ of the first VJFET by setting $V_G$ equal to or less than a negative voltage sufficient to block the applied voltage. The sufficient negative voltage is determined by the blocking voltage characteristics of the first VJFET, as shown above (see FIG. 5). Moreover, the gate drive may selectively apply $V_G$ to block voltages applied to $D_2$ of the second VJFET by setting $V_G$ equal to or less than a negative voltage sufficient to block the applied voltage. The sufficient negative voltage is determined by the blocking voltage characteristics of the second VJFET. The gate drive may determine $V_G$ internally or from receiving a control signal.

Figure 8:
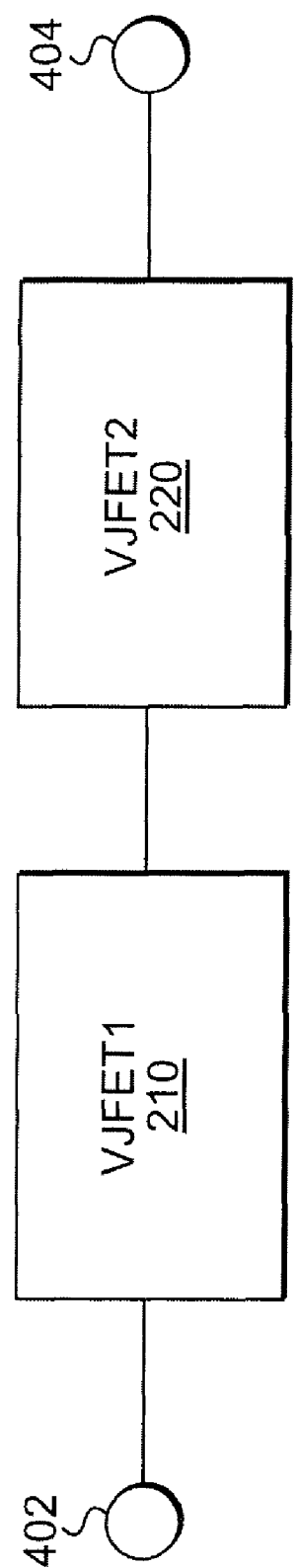
FIG. 8 is a block diagram illustrating an embodiment of a system for providing symmetric, efficient bi-directional power flow in high-voltage power conditioning applications.

With reference now to FIG. 8, shown is an embodiment of system 200 in a high-voltage application with high-voltage input/output points 402 and 404. It is important to note that system 200 works to provide symmetric, efficient bi-directional power flow and power conditioning using two high voltage VJFETs connected in series without requiring additional devices, circuitry or components between them. Unlike U.S. Patent Application Publication 20060098363 to Hebert et al. ("Hebert"), system 200 simply provides two back-to-back high voltage VJFETs with their sources connected together at a common point S (and a gate drive that provides a common gate bias, $V_G$, to operate the VJFETs). System 200 requires only two high voltage VJFETs with no circuitry between them, while Hebert requires substantial additional circuitry between its high voltage devices; for example, as shown in FIG. 4 of Hebert (which does not show the gate drive circuitry required to operate the two high voltage devices and the three devices between them), Hebert requires at least three devices and two sets of diode/resistor or combination elements between high voltage devices. Hebert does use an integrated circuit (IC) between high voltage devices, but the IC simply incorporates all of the devices shown as necessary in FIG. 4 of Herbert. As shown in FIG. 8, system 200 includes two high voltage VJFET devices 210 and 220 in order to provide symmetric, efficient bi-directional power flow and power conditioning between the input/output points 402 and 404.

Embodiments of system 200 may be used for a variety of applications. For example, embodiments of system 200 may be used as a solid-state circuit breaker to provide bi-directional fault isolation in a fraction of a microsecond in power electronic circuits, such as those used in hybrid vehicles. Presently used mechanical contactors may be too slow and suffer severe degradation during repeated fault isolation. Embodiments of system 200 do not suffer such degradation.

Likewise, embodiments of system 200 may also be used for Army's hybrid military ground vehicles. Additionally, embodiments of system 200 may be used by the Air-Force for their latest generation fighter aircraft 270 DC power system, and by the Navy for their high-voltage ship systems. Embodiments of system 200 may eventually be present in every hybrid vehicle and every power circuit that needs fault protection.

The bi-directional power flow enabled by embodiments of system 200 enables regeneration applications. Industrial applications can reap significant energy savings by returning otherwise wasted energy to AC mains. Examples of such industrial applications that can utilize embodiments of system 200 include rolling mills, conveyor belts, and elevators. In electric-gasoline hybrid vehicles, bidirectional power flow may be needed for the battery to provide a cold start and to receive and store the regenerated energy from braking.

Embodiments of system 200 may also be used in photovoltaic systems interacting with the utility grid. For example, embodiments of system 200 may be used to provide bi-directional flow of solar photovoltaic power to utility AC grid and from utility AC grid to charge the photovoltaic battery bank.

Embodiments of system 200 may provide wind power transfer to the utility grid and back, such as by providing bi-directional power flow between the wind turbine generator and the utility grid.

Embodiments of system 200 may also provide fuel cell bi-directional power flow. In fuel cell hybrid vehicles, the electric drive-train motor is supplied by an inverter connected to a fuel cell. In addition, traditional chemical-power batteries are employed to provide better cold start characteristics and the option to recover braking energy. Bi-directional power flow, such as that provided by embodiments of system 200 are needed to interface the chemical-power battery with the fuel cell.

In short, embodiments of system 200 enable power flow in multiple directions that saves energy and allows interface of power sources with the grid. Current silicon circuitry cannot operate at high temperatures and is less energy efficient. Back-to-back, SiC, other similar composition, VJFETs configured as in system 200 with bias settings as described herein operate fast enough for these applications, do not degrade with faults, can operate at high temperatures and are more energy efficient than current silicon circuitry.

Although in the exemplary embodiments above, VJFETs 210 and 220 have been connected back-to-back with their sources at a common point S, one skilled in the art will recognize that similar results can be obtained by connecting the two VJFETs back-to-back with their drains at a common point S.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A system for providing symmetric, efficient bi-directional power flow and power conditioning for high-voltage applications, comprising:
   a first vertical-channel junction field-effect transistor (VJFET), wherein the first VJFET includes a gate, drain ($D_1$), and source, and has gate-to-drain and gate-to-source built-in potentials;
   a second VJFET, wherein the second VJFET includes a gate, drain ($D_2$), and source, and has gate-to-drain and gate-to-source built-in potentials and the first VJFET and the second VJFET are connected back-to-back in series so that the first VJFET source and the second VJFET source are shorted together at a common point S; and a gate drive coupled to the first VJFET gate and the second VJFET gate, referenced to the common point S, connected to the drain $D_1$ of the first VJFET only through internal circuitry of the first VJFET, and connected to the drain $D_2$ of the second VJFET only through internal circuitry of the second VJFET, wherein the gate drive applies an equal voltage bias ($V_G$) to both the first VJFET gate and the second VJFET gate and the gate drive is configured to selectively bias $V_G$ so that the system allows symmetric current to flow through the first VJFET and the second VJFET in the $D_1$ to $D_2$ direction or to flow through the second VJFET and the first VJFET in the $D_2$ to $D_1$ direction, wherein the current flowing in the $D_1$ to $D_2$ direction is symmetric to the current flowing in the $D_2$ to $D_1$ direction, or so that the system blocks voltages applied to $D_1$ of the first VJFET or $D_2$ of the second VJFET.

2. The system of claim 1 wherein the gate-to-drain and gate-to-source pn junctions of the first VJFET and the second VJFET are biased below their built-in potentials.

3. The system of claim 1 wherein the first VJFET and the second VJFET are fabricated from a wide-bandgap semiconductors chosen from the list consisting of silicon carbide, gallium nitride, gallium arsenide, and diamond.

4. The system of claim 1 wherein $V_G$ may be biased so that the system may block high voltages in excess of 0.5 Kilovolt (kV).

5. The system of claim 1 wherein $V_G$ is selectively biased to allow current to flow through the first VJFET and the second VJFET in the $D_1$ to $D_2$ direction by setting $V_G$ equal to or less than the gate-to-drain built-in potential of the second VJFET minus the absolute value of the voltage measured across $D_2$ to S.

6. The system of claim 1 wherein $V_G$ is selectively biased to allow current to flow through the second VJFET and the first VJFET in the $D_2$ to $D_1$ direction by setting $V_G$ equal to or less than the gate-to-drain built-in potential of the first VJFET minus the absolute value of the voltage measured across $D_1$ to S.

7. The system of claim 1 wherein $V_G$ is selectively biased to block voltages applied to $D_1$ of the first VJFET by setting $V_G$ equal to or less than a negative voltage sufficient to block the applied voltage, wherein the sufficient negative voltage is determined by the blocking voltage characteristics of the first VJFET.

8. The system of claim 1 wherein $V_G$ is selectively biased to block voltages applied to $D_2$ of the second VJFET by setting $V_G$ equal to or less than a negative voltage sufficient to block the applied voltage, wherein the sufficient negative voltage is determined by the blocking voltage characteristics of the second VJFET.

9. The system of claim 1 wherein the built-in potential of each VJFET is approximately 2.7 volts.

10. The system of claim 1 in which the gate drive includes control circuitry configured to selectively set $V_G$.

11. The system of claim 1 in which the gate drive sets the bias $V_G$.

12. The system of claim 10 in which the gate drive determines at what voltage to bias $V_G$ based on a received signal.

13. A solid-state circuit breaker comprising the system of claim 1.

14. A method for providing symmetric, efficient bi-directional power flow and power conditioning for high-voltage applications, comprising:

providing a first vertical-channel junction gate field-effect transistor (VJFET), wherein the first VJFET includes a gate, drain ($D_1$), and source, and has gate-to-drain and gate-to-source built-in potentials;

providing a second VJFET, wherein the second VJFET includes a gate, drain ($D_2$), and source, and has gate-to-drain and gate-to-source built-in potentials;

connecting the first VJFET and the second VJFET back-to-back in series so that the first VJFET source and the second VJFET source are shorted together at a common point S;

coupling a gate drive to the first VJFET gate and the second VJFET gate wherein the gate drive is referenced only to the common point S, connected to the drain $D_1$ of the first VJFET only through internal circuitry of the first VJFET, and connected to the drain $D_2$ of the second VJFET only through internal circuitry of the second VJFET; and selectively applying an equal voltage bias ($V_G$) from the gate drive to both the first VJFET gate and the second VJFET gate so that symmetric current flows through the first VJFET and the second VJFET in the $D_1$ to $D_2$ direction or flows through the second VJFET and the first VJFET in the $D_2$ to $D_1$ direction, wherein the current flowing in the $D_1$ to $D_2$ direction is symmetric to the current flowing in the $D_2$ to $D_1$ direction, or so that voltages applied to $D_1$ of the first VJFET or $D_2$ of the second VJFET are blocked.

15. The method of claim 14 wherein the gate-to-drain and gate-to-source pn junctions of the first VJFET and the second VJFET are biased below their built-in potentials.

16. The method of claim 14 comprising the gate drive determining $V_G$.

17. The method of claim 14 wherein the gate drive determining $V_G$ comprises the gate drive receiving a control signal.

18. The method of claim 14 wherein the selectively applying comprises the gate drive selectively biasing $V_G$ to allow current to flow through the first VJFET and the second VJFET in the $D_1$ to $D_2$ direction by setting $V_G$ equal to or less than the gate-to-drain built-in potential of the second VJFET minus the absolute value of the voltage measured across $D_2$ to S.

19. The method of claim 14 wherein the selectively applying comprises the gate drive selectively biasing $V_G$ to allow current to flow through the second VJFET and the first VJFET in the $D_2$ to $D_1$ direction by setting $V_G$ equal to or less than the gate-to-drain built-in potential of the first VJFET minus the absolute value of the voltage measured across $D_1$ to S.

20. The method of claim 14 wherein the selectively applying comprises the gate drive selectively biasing $V_G$ to block voltages applied to $D_1$ of the first VJFET by setting $V_G$ equal to or less than a negative voltage sufficient to block the applied voltage, wherein the sufficient negative voltage is determined by the blocking voltage characteristics of the first VJFET.

21. The method of claim 14 wherein the selectively applying comprises the gate drive selectively biasing $V_G$ to block voltages applied to $D_2$ of the second VJFET by setting $V_G$ equal to or less than a negative voltage sufficient to block the applied voltage, wherein the sufficient negative voltage is determined by the blocking voltage characteristics of the second VJFET.

* * * * *